(12) United States Patent
Tamaki

(10) Patent No.: US 6,219,300 B1
(45) Date of Patent: Apr. 17, 2001

(54) SEMICONDUCTOR DEVICE

(75) Inventor: Leiji Tamaki, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/411,836

(22) Filed: Oct. 4, 1999

(30) Foreign Application Priority Data

Feb. 16, 1999 (JP) ................................... 11-036953

(51) Int. Cl.$^7$ ....................................................... G11C 8/00
(52) U.S. Cl. ................. 365/233; 365/189.07; 365/189.01
(58) Field of Search ............................. 365/233, 189.07, 365/189.05, 230.03, 230.06, 230.08, 189.01; 713/501

(56) References Cited

U.S. PATENT DOCUMENTS 5,586,081 * 12/1996 Mills et al. ....................... 365/230.08
5,991,889 * 11/1999 Hikichi et al. ........................ 713/501
6,014,333 * 1/2000 Mochida ........................... 365/189.05

FOREIGN PATENT DOCUMENTS 5-81865   4/1993 (JP).
6-275081  9/1994 (JP).

* cited by examiner

Primary Examiner—David Nelms
Assistant Examiner—David Lam
(74) Attorney, Agent, or Firm—Burns, Doane, Swecker & Mathis, LLP

(57) ABSTRACT

A readout circuit (3) determines the level of a signal held in a memory cell array (1) and outputs a high- or low-level signal to a data line (D) according to the comparison result. The readout circuit (3) comprises a first readout circuit (3a) with high operating speed and a second readout circuit (3b) with low power consumption. A selecting circuit (4) selects either of the first and second readout circuits (3a, 3b) on the basis of a selection signal (S) and drives the selected circuit in synchronization with an enable signal (E). This achieves high-speed operation in applications or operating periods where high speed is required, and reduces unnecessary power consumption in applications or operating period where high speed is not required. As a result, unnecessary power consumption in read operation is reduced.

18 Claims, 15 Drawing Sheets

F/G. 19

SEMICONDUCTOR DEVICE

BACKGROUND OF THE INVENTION

1. Field of the Invention

The present invention relates to a semiconductor device comprising a memory cell array and especially to improvements for suppressing power consumption or the wearing out of memory cells.

2. Description of the Background Art

FIG. 24 is a block diagram schematically showing a configuration of a conventional semiconductor device with a semiconductor memory. This conventional device 150 comprises a memory cell array 91, a readout circuit 93, a word line decoder 97, and a bit line selector 98. The memory cell array 91 is provided with a plurality of memory cells (not shown) each connected to one of word lines W and one of bit lines B.

When reading out data held in memory cells, the device 150 operates as follows: First, an address signal A is entered which specifies one memory cell to be read among the plurality of memory cells. Then, the word line decoder 97 selects and drives one of the plurality of word lines W which is connected to the specified memory cell.

As a result, holding signals of a plurality of memory cells which are connected to the driven word line are output to the bit selector 98 through a plurality of bit lines B. The bit line selector 98 selects one of the plurality of bit lines B which is connected to the specified memory cell and transmits the holding signal obtained through that bit line to the readout circuit 93. The readout circuit 93 determines whether the input holding signal is high or low in level, and outputs that level of signal to a data line D in synchronization with an enable signal E. In this fashion, data is read out from the selected specific memory cell.

For an MCU (microcontroller or microcomputer) in which a CPU and peripheral circuits including a semiconductor memory are incorporated into a single semiconductor chip, in recent years, further speedups have been required and in consideration of environment, there has been the growing need for still further reduction in power consumption. As to speed, it is generally assumed that the operating speed of the readout circuit in the semiconductor memory determines the speed of the entire MCU. As to power consumption, power consumption in the semiconductor memory occupies a large portion of power consumption in the entire MCU.

Speedups and low power consumption are, however, technically conflicting demands, so that it is not easy to achieve both of them. Therefore, it became customary for the MCU users, who make products employing MCUs, to use the MCU with high operating speed and the MCU with low power consumption properly according to their purposes. But some products of the users could be used for such applications that an operating period where speed is paramount and an operating period where low power consumption takes precedence over speed were mixed. Even in such applications, an MCP capable of high-speed operation needs to be used. This results in unnecessary power consumption.

In order to minimize power consumption while using the MCU with high operating speed in such applications, when low power consumption is a high priority, such steps have been taken as to suppress unnecessary operation of the MCU by utilizing an operation-stop or wait mode of the CPU in the MCU or as to keep down the frequency of a clock signal (i.e., internal clock signal), to which the CPU is synchronized, by varying the divisional ratio of an external clock signal fed from the outside to the MCU.

However, the MCU capable of high-speed operation employs, as its readout circuit, a current-driven current mirror circuit with high power consumption. In this circuit, a large current flows in a steady state, so that a slowdown of the operating speed with a low-speed internal clock would make little difference in power consumption. Thus, there has been a problem of incapability in effectively reducing power consumption in the MCU.

The above description illustrates the MCU by way of example, but not only in the MCUs but also in general semiconductor devices with the semiconductor memory, it has been required that the readout circuit should have flexibility and adaptability to the request for high speed or low power consumption according to applications of the device and operating periods.

Further, a nonvolatile semiconductor memory has a problem that the wearing out of memory cells for holding data becomes faster as the operating speed of a write circuit, which forms a pair with the readout circuit, is unnecessarily increased. Therefore, it has also been desired that the write circuit should have flexibility and adaptability to the request for high speed or protection of memory cells according to applications of the device and operating periods.

SUMMARY OF THE INVENTION

A first aspect of the present invention is directed to a semiconductor device comprising: a memory cell array including a plurality of memory cells; a first readout circuit for reading and outputting a signal which is held in a specified memory cell among the plurality of memory cells; and a second readout circuit for reading and outputting a signal which is held in a specified memory cell among the plurality of memory cells, the second readout circuit having a lower operating speed than the first readout circuit, the first and second readout circuits operating exclusively.

According to a second aspect of the present invention, the semiconductor device of the first aspect further comprises: a CPU having access to the memory cell array, the CPU including a register, wherein the first and second readout circuits operate exclusively on the basis of a signal held in the register.

According to a third aspect of the present invention, the semiconductor device of the first aspect further comprises: a CPU operating in synchronization with a clock signal and having access to the memory cell array; a frequency divider for dividing an external clock signal fed from the outside by a plurality of ratios to generate signals having a plurality of periods, and selectively supplying one of the signals to the CPU as the clock signal; and a comparator for comparing a divisional ratio of the clock signal to the external clock signal with a reference value, wherein if the divisional ratio is not smaller than the reference value according to a comparison result of the comparator, the second readout circuit exclusively operates among the first and second readout circuits, and if the divisional ratio is smaller than the reference value, the first readout circuit exclusively operates.

According to a fourth aspect of the present invention, the semiconductor device of the third aspect further comprises: an external terminal, wherein the comparator sets a value indicated by a signal fed from the external terminal as the reference value.

According to a fifth aspect of the present invention, the semiconductor device of the first aspect further comprises: a CPU operating in synchronization with a clock signal and having access to the memory cell array; a reference delay generating circuit generating a pulse representing a predetermined delay time of the clock signal from the start of one clock period, for each of the one clock period; and a judging circuit for determining whether a time when the CPU directs the start of the operation of the first or second readout circuit is within the delay time or not, wherein if the time is within the delay time according to a judgment result of the judging circuit, the first readout circuit exclusively operates among the first and second readout circuits, and if the time is not within the delay time, the second readout circuit exclusively operates.

According to a sixth aspect of the present invention, in the semiconductor device of either of the first through fifth aspects, memory cells to be read by the first and second readout circuit are the same.

A seventh aspect of the present invention is directed to a semiconductor device comprising: a memory cell array including a plurality of memory cells; a first write circuit for writing a data signal to a specified memory cell among the plurality of memory cells in synchronization with an enable signal; and a second write circuit for writing a data signal to a specified memory cell among the plurality of memory cells in synchronization with an enable signal, the second write circuit having a lower operating speed than the first write circuit, the first and second write circuits operating exclusively.

The device of the first aspect is characterized in that it comprises the first readout circuit with a high operating speed and the second readout circuit with a low operating speed and thereby having low power consumption which operate exclusively (i.e., only either one of them selectively operates). This is not disclosed in either Japanese Patent Laid-open No. 5-81865A or No. 6-275081. Therefore, the device can achieve high-speed operation when high speed is required in the read operation, or can suppress unnecessary power consumption when high speed is not required. That is, high-speed operation and low power consumption can be selectively achieved, which was impossible in the conventional techniques. The device is further independently adaptable to various applications having different requirements for reading speed.

In the device of the second aspect, the first or second readout circuit selectively operates on the basis of the signal held in the register in the CPU. This allows switching between high-speed operation and low power consumption by the use of a program (software) defining the operation of the CPU.

In the device of the third aspect, if the divisional ratio of the clock signal is not smaller than the reference value, the readout circuit for low power consumption operates; and if the ratio is smaller, the readout circuit for high-speed operation operates. Therefore, appropriate operation in accordance with the divisional ratio is automatically achieved.

In the device of the fourth aspect, the reference value varies according to the external input. Therefore, even if not only the divisional ratio but also the frequency of the external clock signal vary, appropriate switching is possible between the first and second readout circuits.

In the device of the fifth aspect, if the time when the CPU starts access to the memory cell array is within a predetermined delay time of the clock signal from the start of one clock period, the readout circuit for high-speed operation operates; and when the time is not within the delay time, the readout circuit for low power consumption operates. Therefore, even if the frequency of the clock signal of the CPU varies, appropriate operation in accordance with the frequency is automatically achieved.

In the device of the sixth aspect, the first and second circuits use the same memory cell to determine the level of the holding signal. This allows reduction in the area of the memory cell array to about a half of that in the case where different memory cells having a common address are used.

The device of the seventh aspect comprises the first and second write circuits, one of which has a higher operating speed than the other, wherein either one of them selectively writes the data signal to the memory cell. Therefore, the device can achieve a high-speed operation when high speed is required in the write operation, or can suppress the wearing out of memory cells by lowering the operating speed when high speed is not required. That is, high-speed operation and protection of memory cells can be selectively achieved. The device is further independently adaptable to various applications having different requirements for writing speed.

An object of the present invention is thus to resolve the aforementioned problems in the conventional device and to achieve a semiconductor device wherein the readout or write circuit has flexibility and adaptability to a priority for operating speed thereby to suppress power consumption or the wearing out of memory cells.

It is known that a simple form of a plurality of readout circuits connected to a common data line is disclosed in Japanese Patent Laid-open Nos. 5-81865A and 6-275081.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. Outline of Preferred Embodiments>

Figure 1:
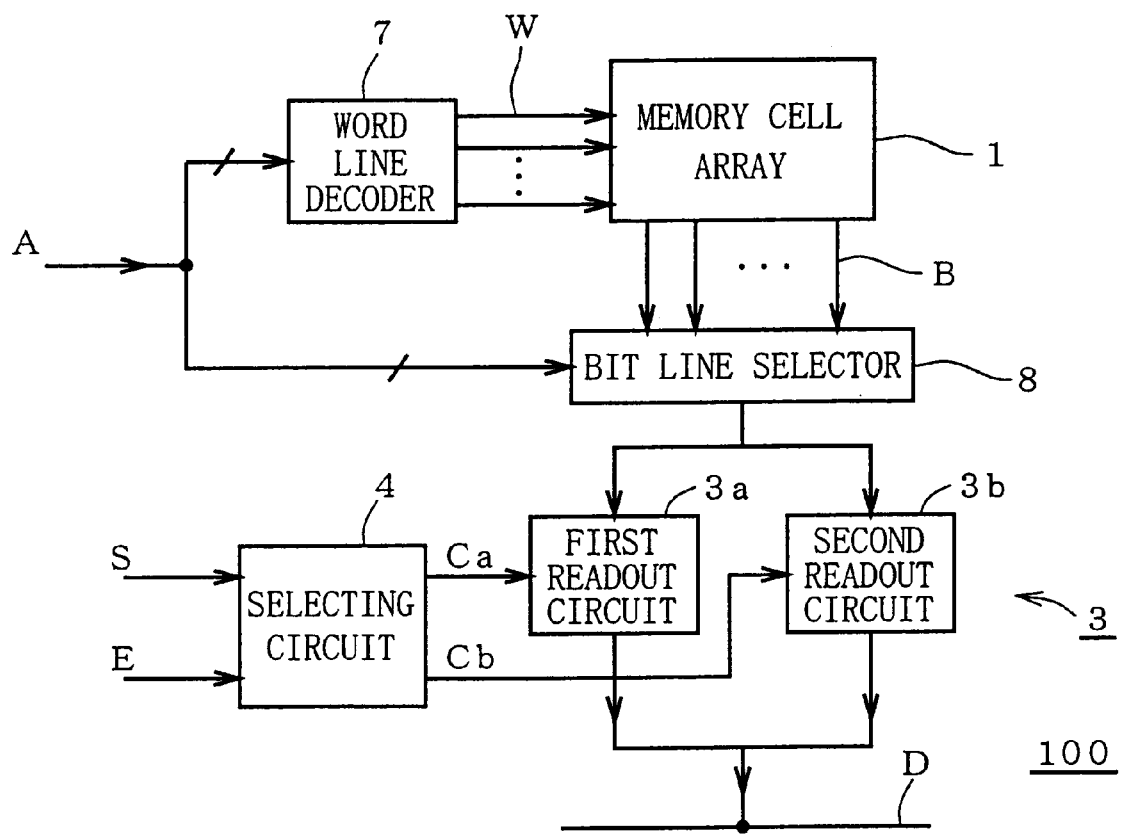
FIG. 1 is a block diagram giving an outline of preferred embodiments.

FIG. 1 is a block diagram giving an outline of preferred embodiments according to the present invention. This device 100 comprises a memory cell array 1, a readout circuit 3, a word line decoder 7, a bit line selector 8, and a selecting circuit 4. The memory cell array 1 is provided with a matrix of a plurality of memory cells (not shown). Each of the plurality of memory cells is connected to one of word lines W and one of bit lines B.

When reading out data held in a memory cell, the device 100 operates as follows: First, an address signal A is entered which specifies one memory cell to be read among the plurality of memory cells. Then, the word line decoder 7 selects and drives one of the plurality of word lines W which is connected to the specified memory cell.

As a result, holding signals of a plurality of memory cells which are connected to the driven word line are output to the bit line selector 8 through the plurality of bit lines B. The bit line selector 8 selects one of the plurality of bit lines B which is connected to the specified memory cell and transmits the holding signal obtained through that bit line to the readout circuit 3. The readout circuit 3 is a circuit for reading a holding signal held in the specified memory cell and outputting that signal to the data line D. More specifically, it determines whether the holding signal is high or low in level and outputs that level of signal to the data line D in synchronization with the enable signal E.

In this fashion, data held in the specified memory cell is read out. To enable a simultaneous readout of data of a plurality of bits (i.e., parallel readout), plural sets of the memory cell arrays 1, the bit line selectors 8, and the readout circuits 3 are connected to different data lines D.

The device 100 characteristically differs from the conventional device 150 in that it further comprises the selecting circuit 4 and the readout circuit 3 includes first and second readout circuits 3a, 3b. The first readout circuit 3a is configured to be superior in operating speed to the second readout circuit 3b, whereas the second readout circuit 3b is configured to give lower power consumption than the first readout circuit 3a.

The selecting circuit 4 selectively (exclusively) operates either of the first and second readout circuits 3a, 3b on the basis of an input selection signal S. More specifically, when the selection signal S specifies the first readout circuit 3a, the selecting circuit 4 asserts a control signal Ca which functions as an enable signal of the first readout circuit 3a, in synchronization with the enable signal E. When the selection signal S specifies the second readout circuit 3b, on the other hand, the selecting circuit 4 asserts a control signal Cb which functions as an enable signal of the second readout circuit 3b, in synchronization with the enable signal E.

Performing the read operation in this fashion, the device 100 can achieve high-speed operation in applications or operating periods where speed is required, and can suppress power consumption in applications or operating periods where low power consumption takes precedence over speed. As previously described, in the semiconductor device with a semiconductor memory, the speed of the readout circuit determines the speed of the entire device and power consumption in the readout circuit occupies an unignorable portion of power consumption in the entire device. Thus, the device 100 can effectively save the power consumption. There are various forms for setting the selection signal S. Those forms will be described in first through fifth preferred embodiments.

It is also possible to selectively (exclusively) operate a write circuit (not shown) having a plurality of characteristics as well as the readout circuit. This suppresses the wearing out of memory cells. The detail will be described in a sixth preferred embodiment.

The memory cells to be read by the first and second readout circuits 3a, 3b do not have to be the same but may be different as long as having a common address. This will be described later as a modification.

<B.1. First Preferred Embodiment>

We will now describe a first preferred embodiment.

<B.1.1. General Device Configuration>

Figure 2:
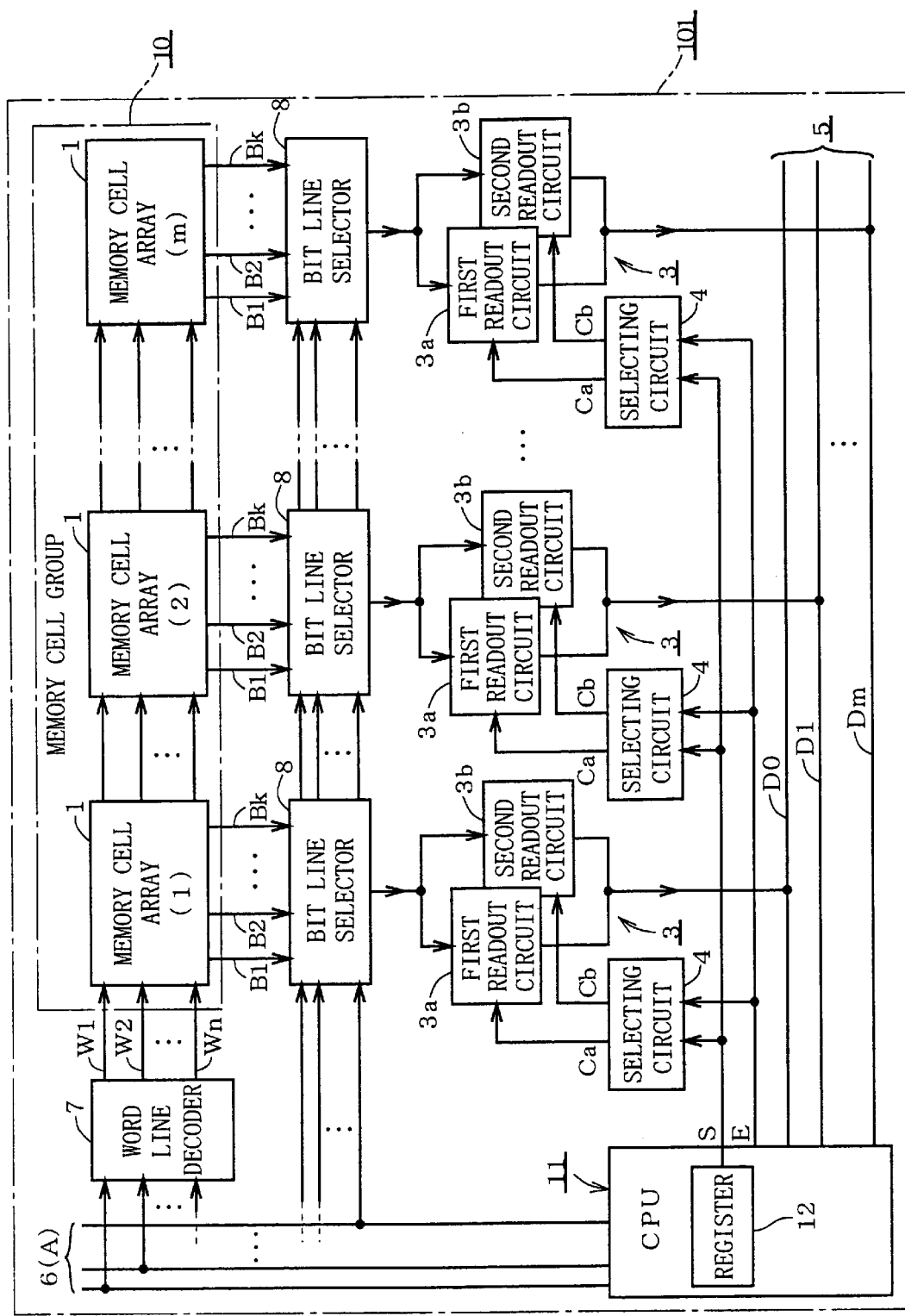
FIG. 2 is a block diagram of a device according to a first preferred embodiment.

FIG. 2 is a block diagram showing a configuration of a semiconductor device according to the first preferred embodiment. In this device 101, a CPU 11, a semiconductor memory, a data bus 5, and an address bus 6 are provided in a single semiconductor chip. The semiconductor memory comprises a memory cell array group 10, the word line decoder 7, the bit line selector 8, the readout circuits 3, and the selecting circuit 4. The readout circuit 3 includes the first readout circuit 3a with high operating speed and the second readout circuit 3b with low power consumption. In a single readout circuit 3, the first and second readout circuits 3a and 3b are connected in parallel with each other.

In the device 101, the memory cell array group 10 comprises m memory cell arrays 1 so as to enable a parallel readout of m bits of data (m ≧ 2). Each of the m memory cell arrays 1 has a common address space. There are also provided m sets of the bit line selector 8, the readout circuit 3, and the selecting circuit 4, the sets being connected to the m memory cell arrays 1 in a one-to-one relationship. The m readout circuits 3 are connected to data lines D0 to Dm which constitute the data bus 5, in a one-to-one relationship.

Instead of providing the selecting circuit 4 separately for each readout circuit 3, the m readout circuits 3 may be connected to a common single selecting circuit 4. In this case, the device 101 only has to comprise one selecting circuit 4.

The CPU 11 is configured to have access to the semiconductor memory. That is, the CPU 11 controls the operation of the semiconductor memory. When reading out data held in memory cells, the CPU 11 first outputs the address signal A to the address bus 6. The word line decoder 7 decodes the address signal A to drive one of a plurality of word lines W1 to Wn which is connected to a memory cell specified by the address signal A, i.e., a memory cell to be read.

In each of the m memory cell arrays 1, therefore, holding signals of a plurality of memory cells which are connected to the driven word line are outputted to the bit selector 8 through bit lines B1 to Bk. By decoding the address signal A, the bit line selector 8 selects one of the bit lines B1 to Bk which is connected to the memory cell specified by the address signal A, and transmits the holding signal obtained through that bit line to the readout circuit 3. As a result, m bits of holding signals, which are read out from the m memory cell arrays 1, are individually and simultaneously fed to the m readout circuits 3.

The CPU 11 comprises a register 12 which holds the selection signal S. The selection signal S held in the register 12 is fed to the selecting circuit 4. The CPU 11 further transmits the active enable signal E to the selecting circuit 4 at an appropriate time after the readout circuit 3 receives the holding signals. In synchronization with the enable signal E, the selecting circuit 4 asserts either the control signal Ca or the control signal Cb. The selection of the control signals Ca and Cb is based on the selection signal S.

When the control signal Ca or Cb is asserted, either one of the first and second readout circuits 3a and 3b starts operating in response, in each of the m readout circuits 3. High- or low-level output signals of the m first readout circuits 3a or the m second readout circuits 3b are individually and simultaneously output to m data lines D0 to Dm which constitute the data bus 5. Data having m bit width outputted to the data bus 5 are read by the CPU 11.

In the device 101, thus, the selection signal S is determined by the contents of the register 12 in the CPU 11. This allows switching between the first and second readout circuits 3a and 3b by use of a program defining the operation of the CPU 11. Such a program may be provided in the memory cell array group 10 or in an external storage medium that is connected to the device 101 and accessible by the CPU 11.

In general, application programs used by the users of the device 101 could include a program where high-speed operation is required and a program where speed is not required. Within the same program, also, there could be an operating period where high-speed operation is required and an operating period where speed is not required. According to the contents of such application programs, the device 101 can selectively achieve either high-speed operation or low power consumption.

<B.1.2. Readout Circuit>

Figure 3:
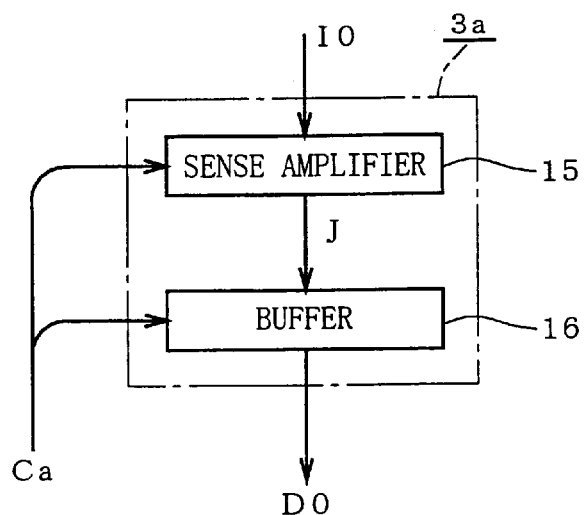
FIG. 3 is a block diagram of a first readout circuit of FIG. 2.

Now, we will describe the internal structure of the first readout circuit 3a and the second readout circuit 3b. FIG. 3 is a block diagram showing a preferable example of the internal structure of the first readout circuit 3a. In this example, the first readout circuit 3a includes a sense amplifier 15 and a buffer 16. The sense amplifier 15 determines the level of a holding signal I0 of a memory cell which is fed through the bit line selector 8, and according to the determined result, generates a high- or low-level output signal J. The sense amplifier 15 then outputs the output signal J in response to the active control signal Ca.

The buffer 16 outputs the output signal J for example to the data line I0 in response to the active control signal Ca. Instead of the same control signal Ca, different control signals may be fed to the sense amplifier 15 and the buffer 16, thereby to provide a delay between the output timing of the output signal J from the sense amplifier 15 and the output timing of data from the buffer 16. This allows the output of a more stabilized signal to the data line D0.

Figure 4:
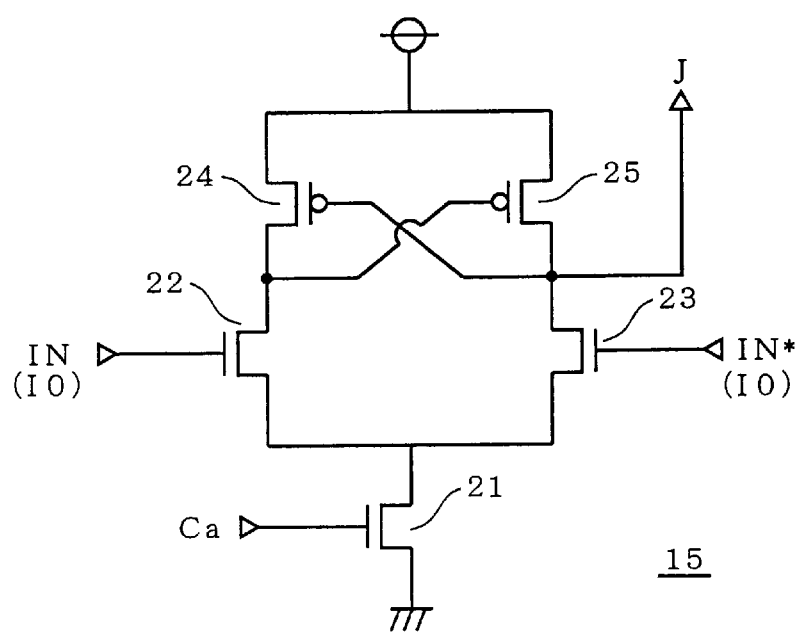
FIG. 4 is a circuit diagram showing an example of a sense amplifier of FIG. 3.

FIG. 4 is a circuit diagram showing an example of the internal structure of the sense amplifier 15. In the sense amplifier 15, NMOSs 22, 23 and PMOSs 24, 25 constitute a differential amplifier. The sense amplifier 15 further comprises an NMOS 21 to turn on/off the differential amplifier. It is configured on the assumption that each memory cell in the memory cell array 1 stores a pair of a non-inverted signal IN and an inverted signal IN* as holding signals I0.

The non-inverted signal IN enters at a gate electrode of the NMOS 22 and the inverted signal IN* enters at a gate electrode of the NMOS 23. When the input control signal Ca is active (in this case, at a high level), the NMOS 21 is turned on and the differential amplifier is brought to its operating state. As a result, a high- or low-level output signal J, which is obtained through the amplification of a difference between the non-inverted signal IN and the inverted signal IN*, is output from a drain electrode of the PMOS 25.

When the control signal Ca is normal, the NMOS 21 is turned off and the differential amplifier becomes inactive. When the differential amplifier is in the inactive state, no consumptive current flows in the sense amplifier 15. When the differential amplifier is in the active state, on the other hand, consumptive current continuously flows in the sense amplifier 15 even in a steady state where the output signal J is fixed at either a high or low level. Thus, the sense amplifier 15 of FIG. 4 has characteristics of high operating speed and high current consumption.

Figure 5:
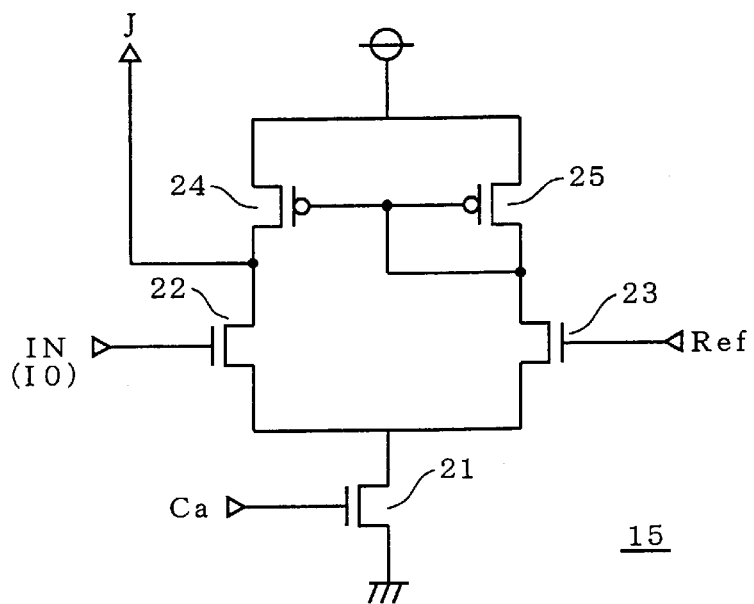
FIG. 5 is a circuit diagram showing another example of the sense amplifier of FIG. 3.

FIG. 5 is a circuit diagram showing another example of the internal structure of the sense amplifier 15. In this sense amplifier 15, also, NMOSs 22, 23 and PMOSs 24, 25 constitute the differential amplifier. The sense amplifier 15 further comprises the NMOS 21 to turn on/off the differential amplifier. This sense amplifier 15 is adaptable to a memory cell array 1 in which each memory cell stores only a non-inverted signal as a holding signal.

The holding signal I0 enters at the gate electrode of the NMOS 22. When each memory cell holds a pair of the non-inverted signal IN and the inverted signal IN*, only either of the signals is fed as the holding signal I0 as shown in FIG. 5. The gate electrode of the NMOS 23 receives a reference potential Ref generated in a reference potential generating circuit (not shown). The reference potential Ref is set at a boundary between high and low levels of the holding signal I0. Instead of providing the reference potential generating circuit, it is also possible to set a reference memory cell and use the holding signal of that memory cell.

When the differential amplifier is activated by the input of the active control signal Ca, a high- or low-level output signal J, which is obtained through the amplification of a difference between the holding signal I0 and the reference potential Ref, is output from a drain electrode of the PMOS 24. Thus, the sense amplifier 15 of FIG. 5 also has characteristics of high operating speed and high current consumption.

Figure 6:
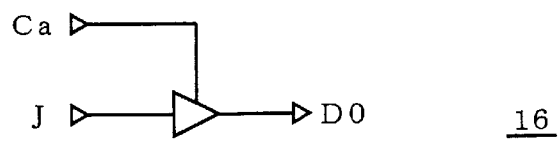
FIG. 6 is a circuit diagram of a buffer of FIG. 3.

FIG. 6 is a circuit diagram showing the internal structure of the buffer 16. This buffer 16 comprises a conventionally known tri-state buffer. When the control signal Ca is active, the tri-state buffer outputs the output signal J directly or through current amplification to the data line D0; and when the control signal Ca is normal, it brings the output to high impedance (cutoff state).

Figure 7:
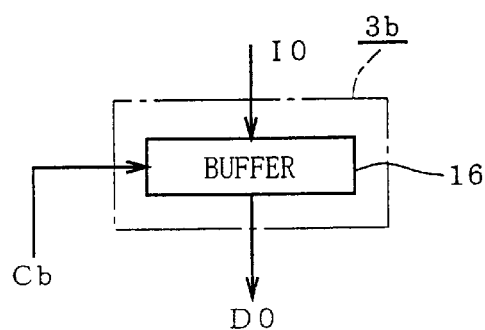
FIG. 7 is a block diagram of a second readout circuit of FIG. 2.

FIG. 7 is a bock diagram showing an example of the internal structure of the second readout circuit 3b. The second readout circuit 3b of FIG. 7 comprises only the buffer 16 without having the sense amplifier 15. The buffer 16, for example, includes a tri-state buffer as shown in FIG. 6, but the transistor size in the buffer 16 is set large in the first readout circuit 3a and small in the second read out circuit 3b. Or, the buffer 16 in the first readout circuit 3a is configured as an NMOS circuit and the buffer 16 in the second readout circuit 3b as a CMOS circuit. The second readout circuit 3b thus gives lower current consumption than the first readout circuit 3a while inferior in the operating speed.

<B.1.3. Selecting Circuit>

Figure 8:
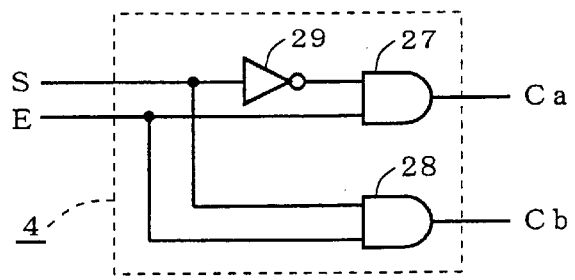
FIG. 8 is a circuit diagram of a selecting circuit of FIG. 2.

FIG. 8 is a circuit diagram showing an example of the internal structure of the selecting circuit 4. This selecting circuit 4 comprises AND circuits 27, 28 and an inverter 29. The AND circuit 27 receives the enable signal E, and an inverted signal of the selection signal S via the inverter 29. The AND circuit 28 receives the selection signal S and the enable signal E.

The AND circuit 27 outputs the active control signal Ca only when the selection signal S is normal and the enable signal E is active. The AND circuit 28 outputs the active control signal Cb only when both the selection signal S and the enable signal E are active. That is, in this example, the selection signal S is normal to select the first readout circuit 3a or active to select the second readout circuit 3b.

Figure 9:
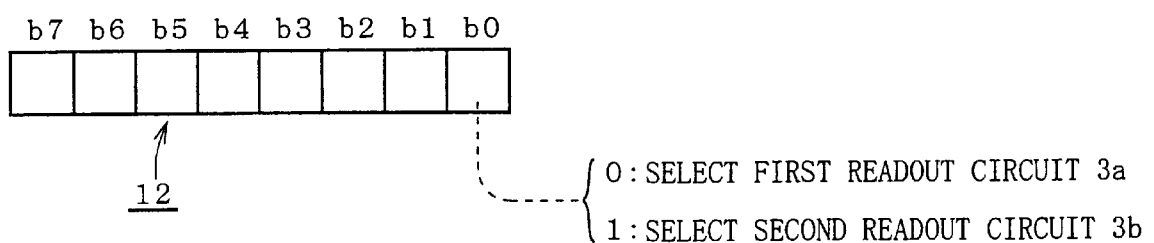
FIG. 9 illustrates the structure of a register of FIG. 2.

FIG. 9 is an illustration schematically showing the internal configuration of the register 12 for holding the selection signal S which is to be fed to the selecting circuit 4. In FIG. 9, the register 12 is configured as an 8-bit register wherein the selection signal S is held in the least significant bit b0.

<B.2. Second Preferred Embodiment>

Figure 10:
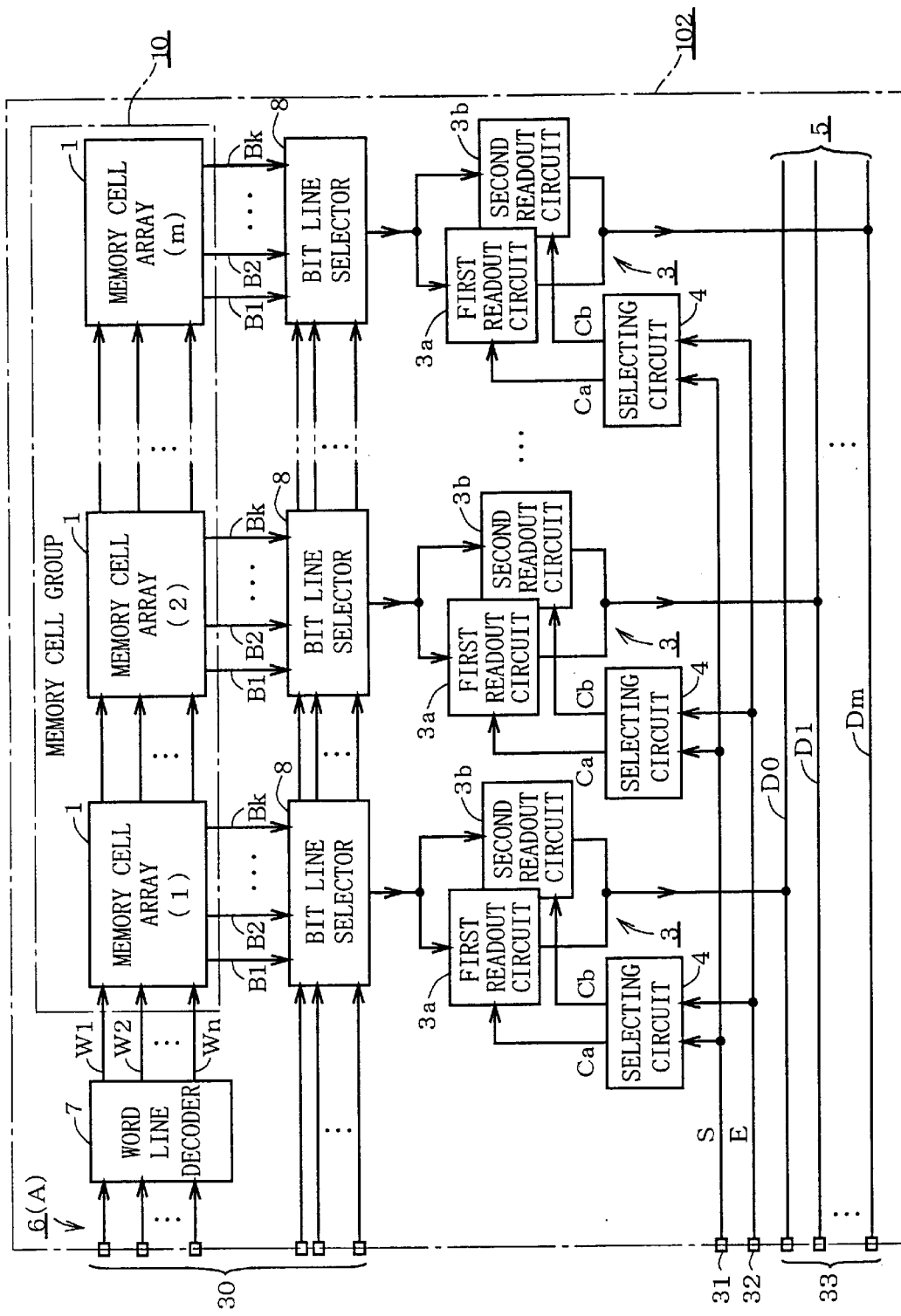
FIG. 10 is a block diagram of a device according to a second preferred embodiment.

FIG. 10 is a block diagram showing a configuration of a semiconductor device according to a second preferred embodiment. This device 102 characteristically differs from the device 101 of the first preferred embodiment in that it does not comprise the CPU 11 and receives the address signal A, the enable signal E, and the selection signal S for controlling the semiconductor memory from the outside.

The device 102 further comprises external terminals 30 to 33 which are connectable to external devices. The address bus 6 for transmitting the address signal A is connected to the external terminals 30; signal lines for transmitting the selection signal S and the enable signal E are connected to the external terminals 31 and 32, respectively; and the data bus 5 for transmitting the data signal is connected to the external terminals 33.

By receiving the selection signal S from the outside, the device 102 with no CPU 11 can selectively use either the first readout circuit 3a or the second readout circuit 3b according to their applications or the operating periods. That is, high-speed operation and low power consumption can be selectively achieved.

<B.3. Third Preferred Embodiment>

Figure 11:
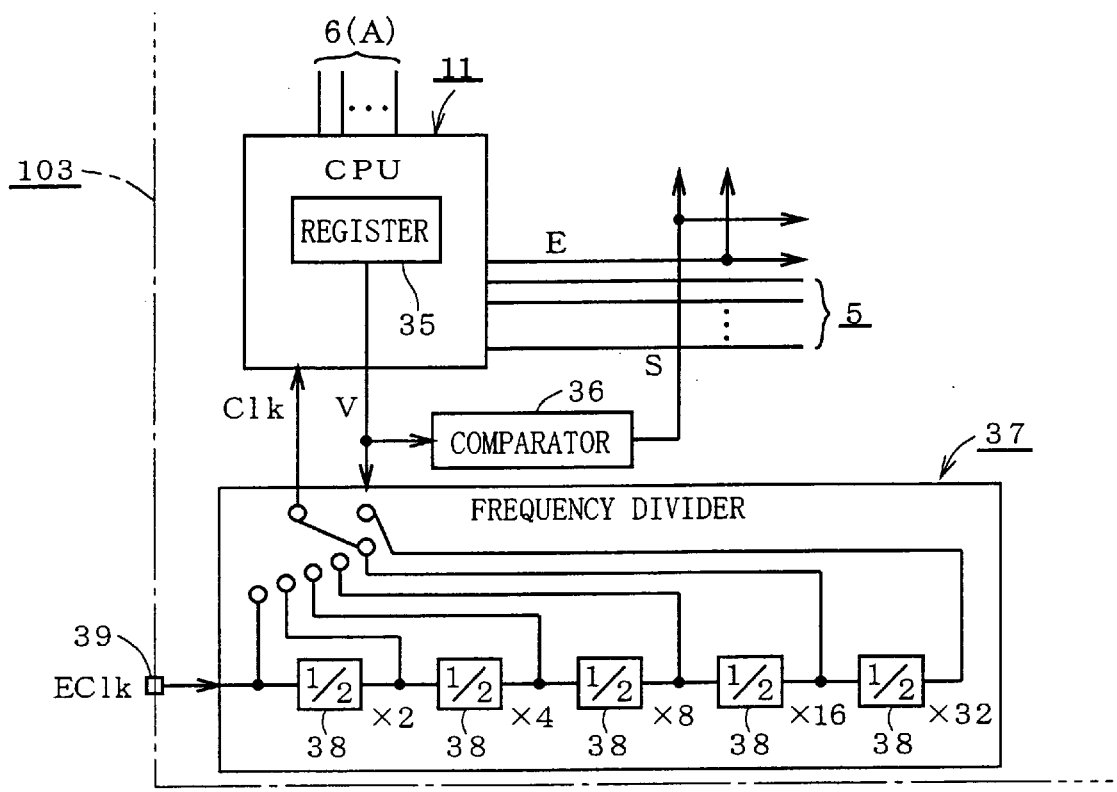
FIG. 11 is a block diagram of a device according to a third preferred embodiment.

FIG. 11 is a block diagram showing part of a configuration of a semiconductor device according to a third preferred embodiment. To clearly show the distinction between FIG. 11 and FIG. 2, identical portions are not shown in FIG. 11. This device 103 characteristically differs from the device 101 of the first preferred embodiment in that it further comprises a frequency divider 37 and a comparator 36, wherein the selection signal S is output not directly but through the comparator 36 from the CPU 11.

The frequency divider 37 includes a plurality of unit frequency dividers 38 connected in tandem. Each unit frequency divider 38 divides a periodic input pulse thereby to double the period. The device 103 further comprises an external terminal 39 to receive an external clock signal EClk from the outside. The external clock signal EClk is fed through the external terminal 39 to the first unit frequency divider 38 in the frequency divider 37. Then, the external clock signal EClk is divided by 2, 4, . . . , 32 in the frequency divider 37 to generate pulses having a plurality of periods.

The CPU 11 includes a register 35. The frequency divider 37 selects one of the plurality of pulses on the basis of a register value V held in the register 35, and transmits the selected pulse to the CPU 11 as a clock signal Clk. The CPU 11 operates in synchronization with the clock signal Clk, so that a semiconductor memory controlled by the CPU 11 also operates in synchronization with the clock signal Clk.

The comparator 36 compares the register value V with a reference value and determines the value of the selection signal S according to the comparison result. For instance, when the register value V is smaller than the reference value and thus the clock signal Clk with a low divisional ratio (i.e., high frequency) is obtained, the value of the selection signal S is set so as to select the first readout circuit 3a. On the other hand, when the register value V is equal to or larger than the reference value and the clock signal Clk with a high divisional ratio (i.e., low frequency) is obtained, the value of the selection signal S is set so as to select the second readout circuit 3b.

In this fashion, the device 103 performs switching between the first and second readout circuits 3a and 3b according to the divisional ratio of the clock signal Clk to the external clock signal EClk. That is, the first and second readout circuits 3a and 3b are automatically used properly according to the frequency of the clock signal Clk to which the CPU 11 is synchronized.

The CPU 11 can also rewrite the register value V on the basis of the program defining its operation. If necessary, the operating speed of the CPU 11 can be varied according to the types of the program or various operating periods in a single program. Further, since the comparator 36 sets the selection signal S in accordance with a change in the operating speed of the CPU 11, there is no need of instructions to use the first and second readout circuits 3a and 3b properly.

Figure 12:
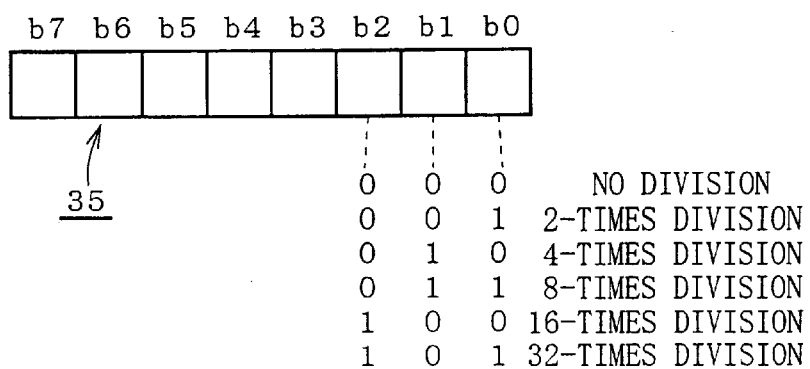
FIG. 12 illustrates the structure of a register of FIG. 11.

FIG. 12 is an illustration schematically showing the structure of the register 35. In this example, the register 35 is configured as an 8-bit register which holds the register value V in its three less significant bits b0 to b2. A relationship between the register value V and the divisional ratio is set so that the divisional ratio is doubled as the register value V is incremented by one.

Figure 13:
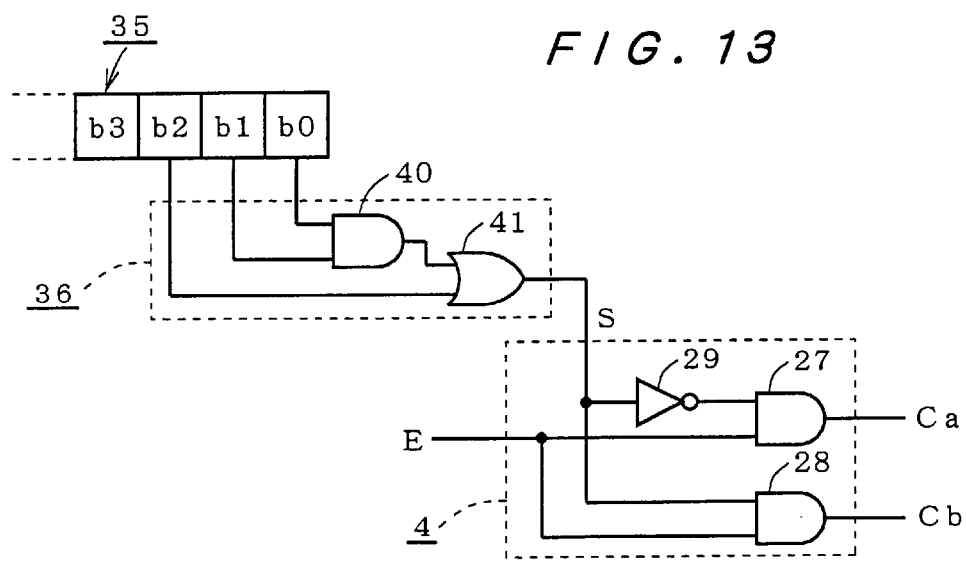
FIG. 13 is a circuit diagram of a comparator of FIG. 11.

FIG. 13 is a circuit diagram showing an example of the internal structure of the comparator 36. This example is based on the premise that the relationship between the register value V and the divisional ratio is as described in FIG. 12. The comparator 36 comprises an AND circuit 40 for outputting the logical product of the bits b0 and b1, and an OR circuit 41 for outputting the logical sum of the output of the AND gate 40 and the bit b2 as the selection signal S.

When the register value V is "011" or more in binary, a high-level signal is output as the selection signal S; and when "010" or less, a low-level signal is output. Thus, when the divisional ratio is 4 or less, the first readout circuit 3a is selected; and when the divisional ratio is 8 or more, the second readout circuit 3b is selected.

<B.4. Fourth Preferred Embodiment>

Figure 14:
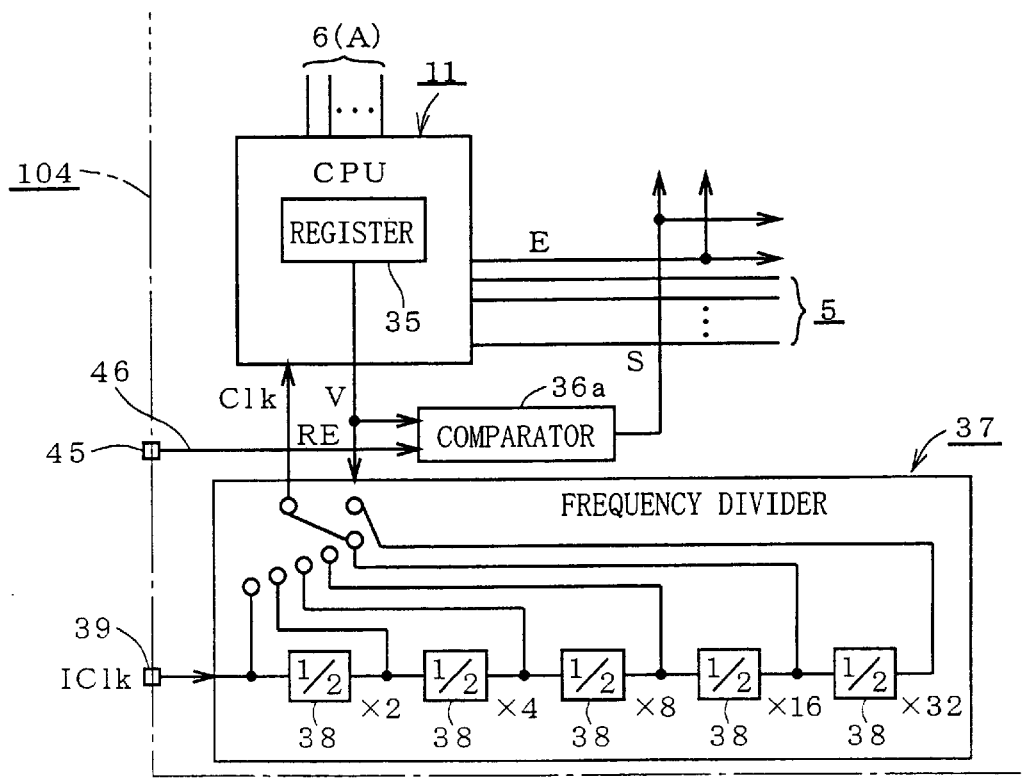
FIG. 14 is a block diagram of a device according to a fourth preferred embodiment.

FIG. 14 is a block diagram showing part of a configuration of a semiconductor device according to a fourth preferred embodiment. In FIG. 14, identical portions to those of FIG. 2 are not shown. This device 104 characteristically differs from the device 103 of the third preferred embodiment in that it receives the reference value to be refereed to by the comparator from the outside. The device 104 comprises a comparator 36a instead of the comparator 36. The device 104 further comprises an external terminal 45 and a signal line 46 to transmit a reference signal RE indicating the reference value to the comparator 36a.

Figure 15:
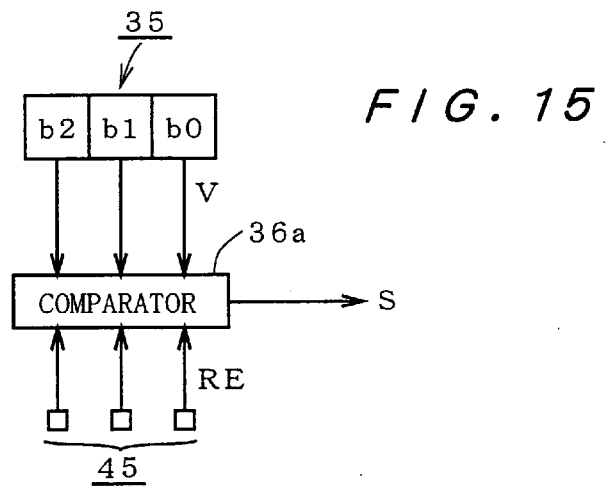
FIG. 15 illustrates the operation of a comparator of FIG. 14.

As shown in FIG. 15, the comparator 36a receives a 3-bit-wide register value V from the register 35, and at the same time, the reference signal RE of the same bit width via the external terminal 45. Comparing those values, the comparator 36a determines the value of the selection signal S according to whether the register value V is larger than the reference signal RE or not.

In the device 104, an external device can set the reference value of the divisional ratio which is referred to in order to use the first and second readout circuits 3a and 3b properly. This makes it possible to set an appropriate reference value according to the frequency of the external clock signal EClk. That is, even if not only the divisional ratio but also the frequency of the external clock signal EClk vary, the device 104 can use the first and second readout circuits 3a and 3b properly.

<B.5. Fifth Preferred Embodiment>

Figure 16:
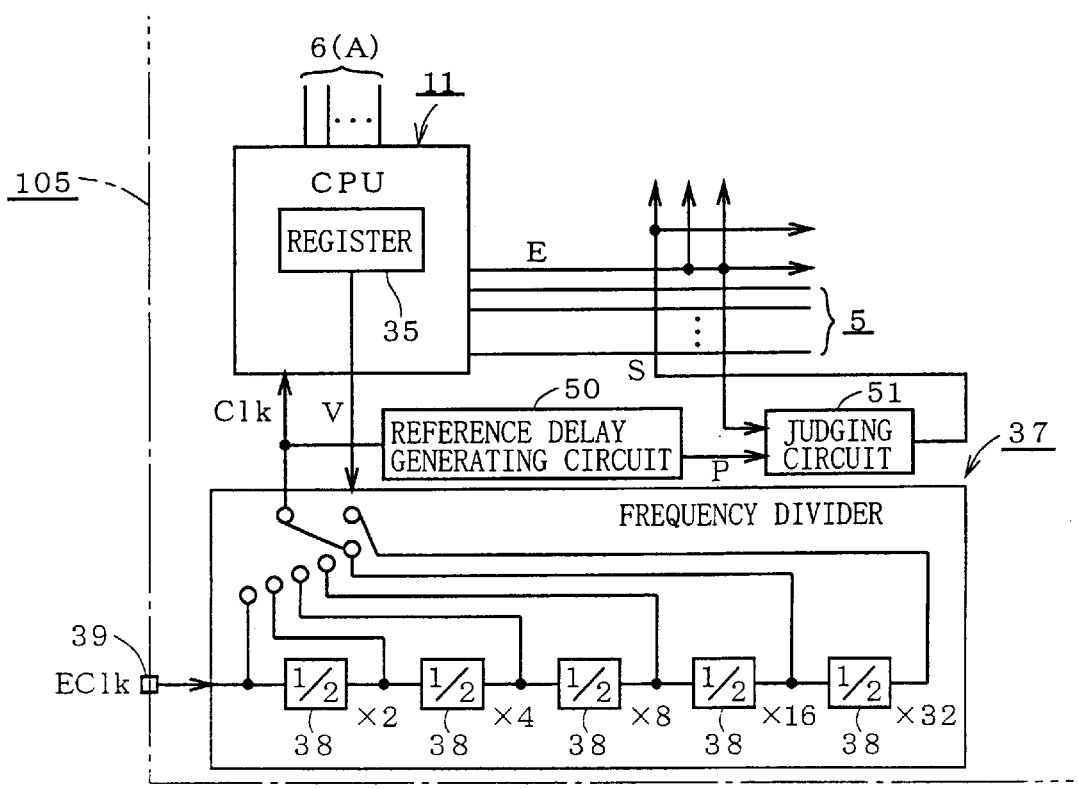
FIG. 16 is a block diagram of a device according to a fifth preferred embodiment.

FIG. 16 is a block diagram showing part of a configuration of a semiconductor device according to a fifth preferred embodiment. In FIG. 16, identical portions to those of FIG. 2 are not shown. This device 105 characteristically differs from the device 103 of the third preferred embodiment in that it comprises a reference delay generating circuit 50 and a judging circuit 51 instead of the comparator 36. The reference delay generating circuit 50 generates a reference delay pulse signal P indicating a predetermined delay time from the start of one clock period which is defined by the rising (or falling) edge of the clock signal Clk. The reference delay generating circuit 50 for example includes a conventionally known one-shot pulse forming circuit for generating a pulse of a predetermined width in synchronization with the rising edge of the clock signal Clk.

Figure 17:
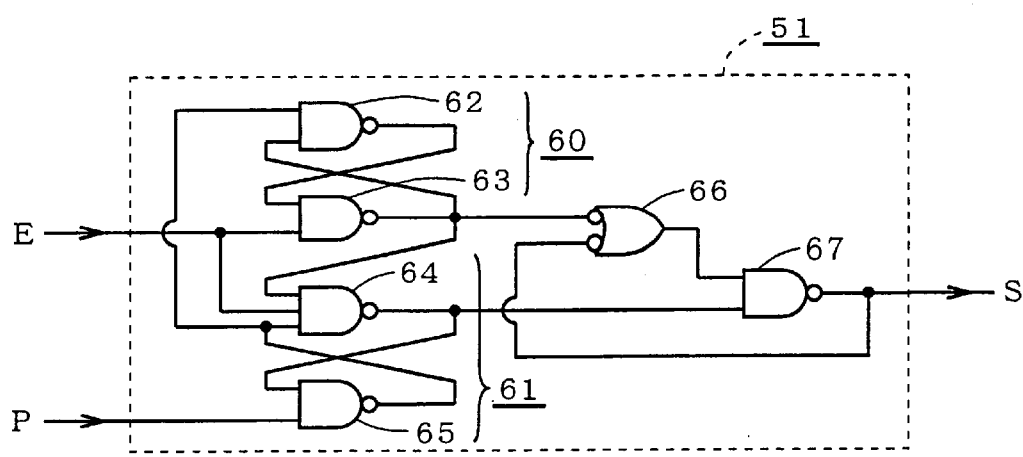
FIG. 17 is a circuit diagram of a judging circuit of FIG. 16.

The judging circuit 51 is a circuit for comparing the reference delay pulse signal P with the enable signal E which directs the start of the read operation of the readout circuit 3, and outputting the selection signal S accordingly. The judging circuit 51 is configured for example as shown in the circuit diagram of FIG. 17. In this example, the judging circuit 51 comprises an SR latch 60 receiving the enable signal E as its set input signal, an SR latch 61 receiving the reference delay pulse signal P as its set input signal, an NAND circuit 66 receiving the output of the SR latch 60 at its one input, and an NAND circuit 67 receiving the respective outputs of the NAND circuit 66 and the SR latch 61 at its two inputs. The SR latch 60 includes NAND circuits 62 and 63, whereas the SR latch 61 includes NAND circuits 64 and 65. The output of the NAND circuit 67 is transmitted to the selecting circuit 4 as the selection signal S, and at the same time fed to the other input of the NAND circuit 66.

Figure 18:
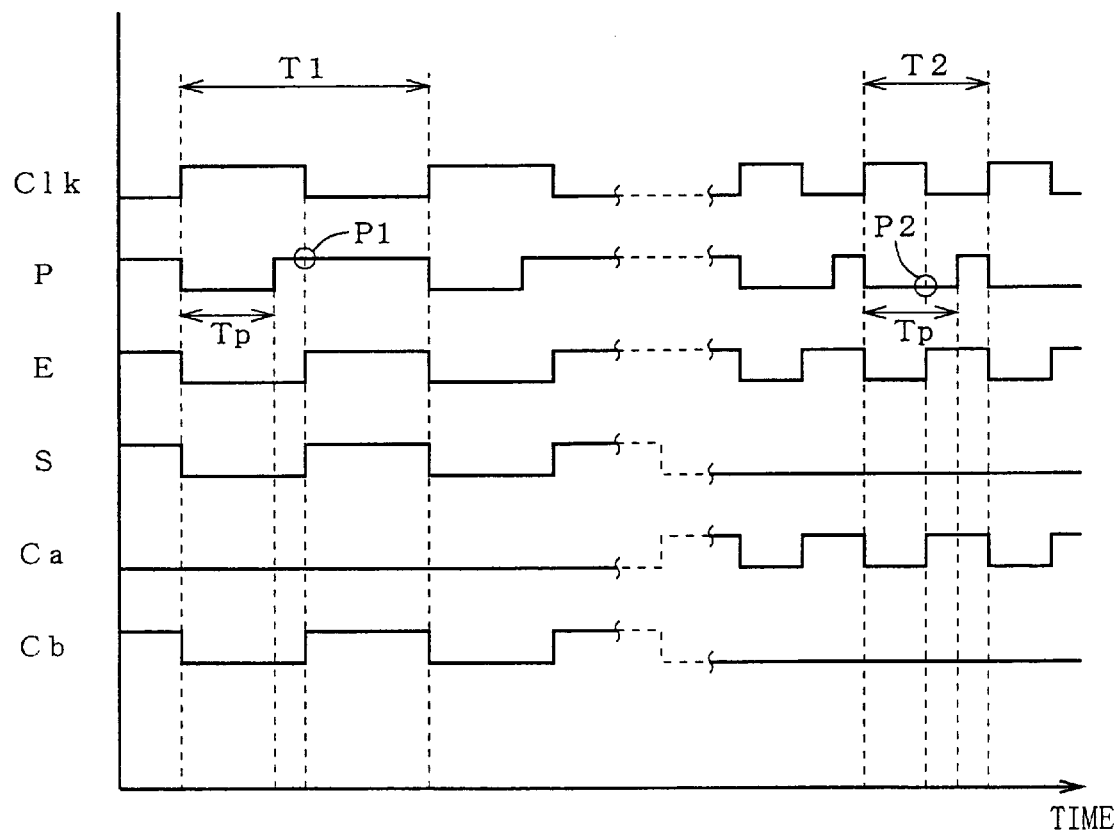
FIG. 18 is a timing chart showing the operation of the device of FIG. 16.

FIG. 18 is a timing chart illustrating the operations of the reference delay generating circuit 50, the judging circuit 51, and the selecting circuit 4. In this example, the reference delay generating circuit 50 generates the reference delay pulse signal P indicating a predetermined delay time Tp from the rising edge of the clock signal Clk. The delay time Tp represented by the low level of the reference delay pulse signal P remains constant whether the period of the clock signal Clk is long (T1) or short (T2).

The enable signal E is output in synchronization with the clock signal Clk. The judging circuit 51 resets the selection signal S at a low level at the falling edges of the reference delay pulse signal P and the enable signal E. The judging circuit 51 further reads the reference delay pulse signal P when the enable signal E rises to its high level, and sets the level of the selection signal S according to the level of the reference delay pulse signal P.

When the clock signal Clk has a long period T1, the enable signal E is read after the expiration of the delay time Tp, so that a level P1 to be read is high. In this case, the judging circuit 51 sets the selection signal S at a high level. Therefore, when the enable signal E is brought into its high level (activated), the control signal Cb becomes high (active) and the control signal Ca is maintained at a low (normal) level. This results in exclusive operation of the second readout circuit 3b among the first and second readout circuits 3a and 3b.

When the clock signal Clk has a short period T2, on the other hand, the time when the enable signal E is read is within the delay time Tp, so that a level P2 to be read is low. In this case, the judging circuit 51 maintains the selection signal S at a low level. Therefore, when the enable signal E is brought into its high level (activated), the control signal Ca becomes high (active) and the control signal Cb is maintained at a low (normal) level. This results in exclusive operation of the first readout circuit 3a among the first and second readout circuits 3a and 3b.

In the device 105, therefore, not the divisional ratio of the clock signal Clk to the external clock signal EClk but the period of the clock signal Clk itself is compared with a predetermined reference value, and according to the comparison result, the selection from the first and second readout circuits 3a, 3b is made. Accordingly, even if the clock signal Clk varies in accordance with a change not only in the divisional ratio but also in the frequency of the external clock signal EClk, the first and second readout circuit 3a, 3b can always be selected properly according to the frequency of the clock signal Clk.

Figure 19:
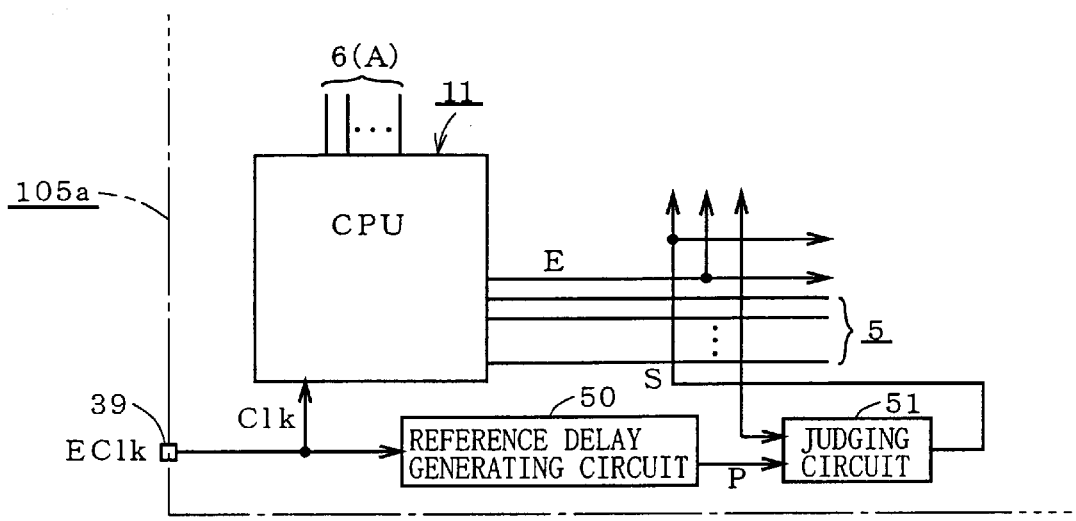
FIG. 19 is a block diagram showing a modification of the device of the fifth preferred embodiment.

Although FIG. 16 showed an example of the device comprising the frequency divider 37 for dividing the external clock signal EClk and supplying it to the CPU 11 as the clock signal Clk, without using the frequency divider 37, the external clock signal EClk fed via the external terminal 39 may be directly supplied to the CPU 11 as the clock signal Clk as shown in FIG. 19. In this device 105a, also, the clock signal Clk is fed to the reference delay generating circuit 50. Consequently, as in the device 105, the first and second readout circuits 3a, 3b can be appropriately selected according to the frequency of the clock signal Clk.

<B.6. Sixth Preferred Embodiment>

Figure 20:
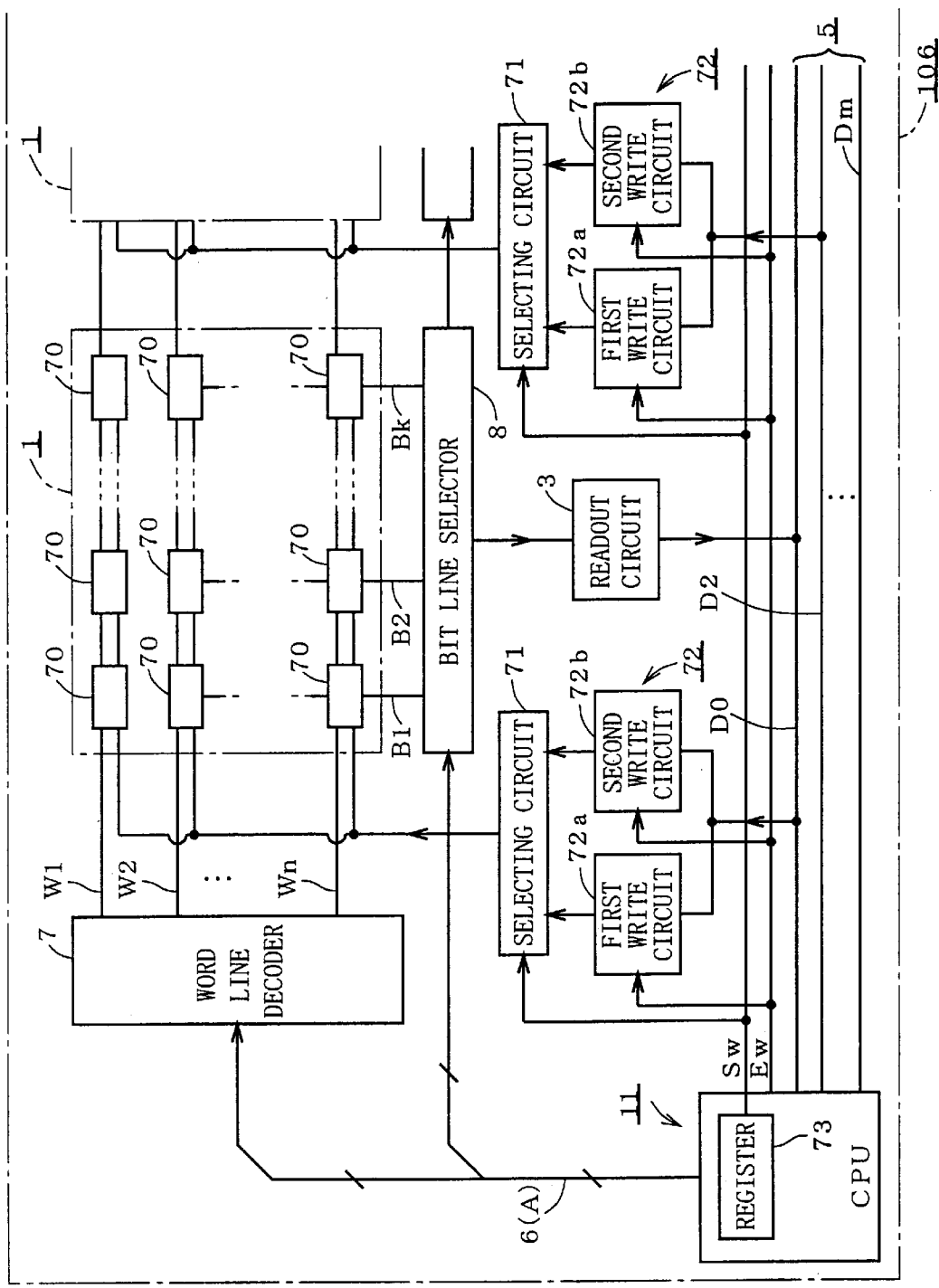
FIG. 20 is a block diagram of a device according to a sixth preferred embodiment.

FIG. 20 is a block diagram showing a configuration of a semiconductor device according to a sixth preferred embodiment. This device 106 characteristically differs from the device 101 of the first preferred embodiment in that it comprises write circuits 72 each including two parallel-connected write circuits 72a and 72b having different characteristics. In the device, each of the readout circuits 3 may include the first and second readout circuits 3a, 3b having different characteristics as described in the first through fifth preferred embodiment, or it may include only a single readout circuit.

FIG. 20 shows only part of m memory cell arrays 1 as representatives. In this device 106, a set of a selecting circuit 71 and a write circuit 72 is provided for each memory cell array 1. The m write circuits 72 are connected to data lines D0 to Dm which constitute the data bus 5, in a one-to-one-relationship.

The write circuit 72 is a circuit for writing a data signal transmitted through a connected data line (e.g., D0) to a specified memory cell 70 in synchronization with an enable signal Ew. The selecting circuit 71 selects either of the data signals output from the first and second write circuits 72a and 72b on the basis of a selection signal Sw and transmits the selected data signal to every memory cell 70 in the memory cell array 1. The CPU 11 includes a register 73 in which the selection signal Sw is held. The enable signal Ew is also fed from the CPU 11.

Figure 21:
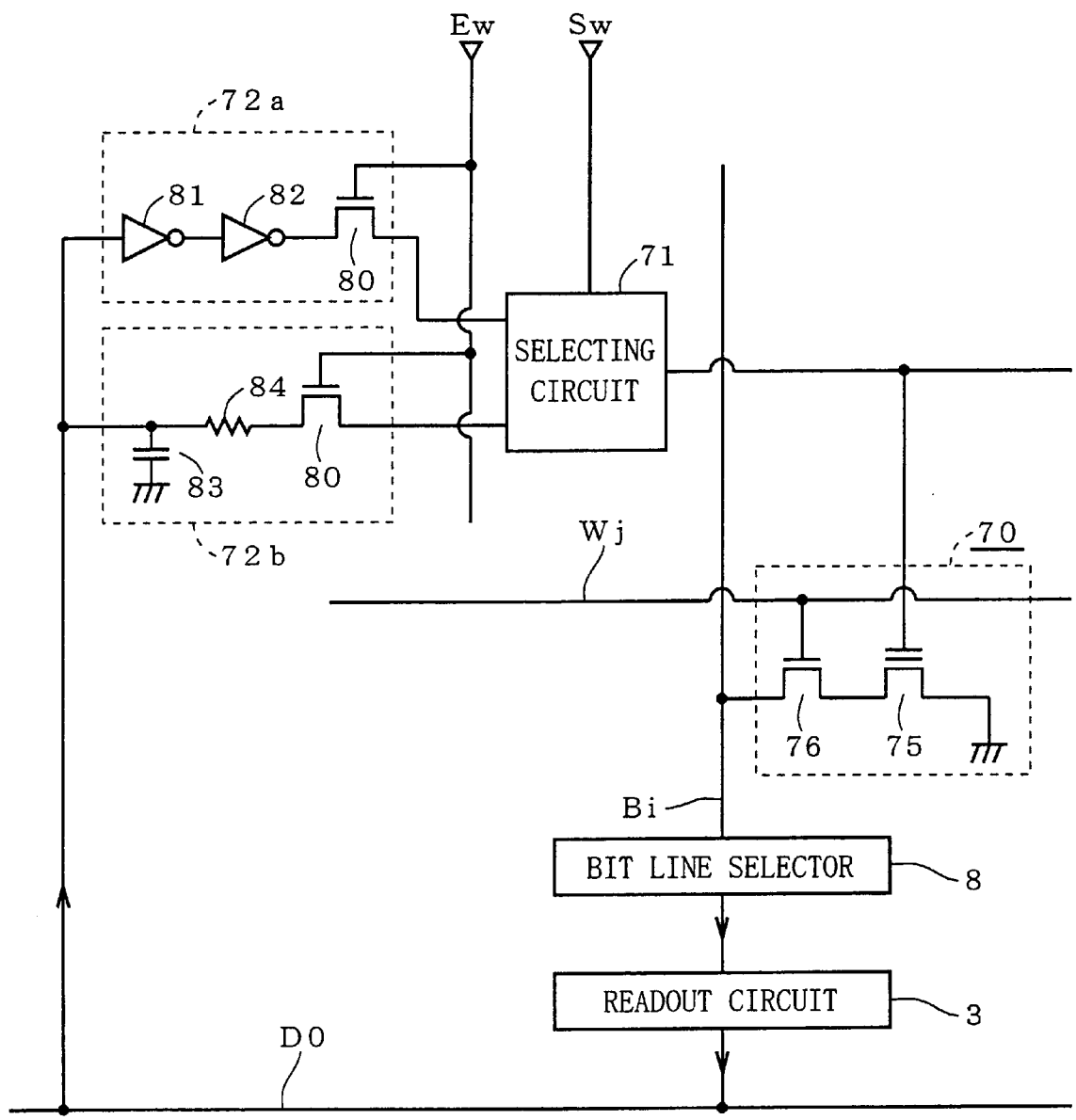
FIG. 21 is a circuit diagram showing the structure of a write circuit and a memory cell of FIG. 20.

FIG. 21 is a circuit diagram showing the internal structure of the first write circuit 72a, the second write circuit 72b, and the memory cell 70. The memory cell 70 comprises a storage element 75 and a transfer gate 76 connected in series. The storage element 75 is, for example, an MOS transistor having ferroelectric in its gate insulating layer. The storage element 75 is connected at its one main electrode to a ground potential line and at its gate electrode to a signal line for transmitting the output signal of the selecting circuit 71. The transfer gate 76 is connected at its one main electrode to one of bit lines B1 to Bk (e.g., Bi) and at its gate electrode to one of word lines W1 to Wn (e.g., Wj).

The first write circuit 72a comprises inverters 81, 82 and a transfer gate 80 connected in tandem. The input of the inverter 81 is connected for example to the data line D0, and one main electrode of the transfer gate 80 is connected to one input of the selecting circuit 71. The gate electrode of the transfer gate 80 is connected to a signal line for transmitting the enable signal Ew.

The second write circuit 72b comprises an integrating circuit including a capacitor 83 and a resistive element 84, and a transfer gate 80 which are connected in tandem. The input of the integrating circuit is connected for example to the data line D0, and one main electrode of the transfer gate 80 is connected to the other input of the selecting circuit 71. The transfer gate 80 receives, like the transfer gate 80 of the first write circuit 72a, the enable signal Ew at its gate electrode. The selecting circuit 71 is for example configured as a conventionally known two-input selector.

Referring now to FIGS. 20 and 21, we will describe the write operation. When writing a data signal to the memory cells 70, the CPU 11 first outputs the address signal A to the address bus 6. The word line decoder 7 decodes the address signal A to drive one of the plurality of word lines W1 to Wn (e.g., Wj) which is connected to a memory cell specified by the address signal A, i.e., a memory cell to be written.

Simultaneously, the bit selector 8 decodes the address signal A to drive one of the bit lines B1 to Bk (e.g., Bi) which is connected to the memory cell specified by the address signal A. Consequently, the transfer gate 75 connected to the word line Wj and the bit line Bi is turned on.

The CPU 11 then asserts the enable signal Ew (at a high level in FIG. 21), whereby a data signal transmitted for example through the data line D0 is fed to the two inputs of the selecting circuit 71 through both the first and second write circuits 72a and 72b. The selecting circuit 71 selects either of the output signals of the first and second write circuits 72a and 72b on the basis of the selection signal Sw held in the register 73 and transmits the selected output signal to gate electrodes of all storage elements 75 in the memory cell array 1.

Since voltage is applied between a pair of main electrodes of a storage element 75 of only one memory cell which is specified by the address signal A (i.e., a memory cell with an on-state transfer gate 76) among the plurality of memory cells 70 in the memory cell array 1, the output data signal of the selecting signal 71 is written only to that storage element 75. Then, the enable signal Ew returns to its normal state, which is the end of the write operation.

Figure 22:
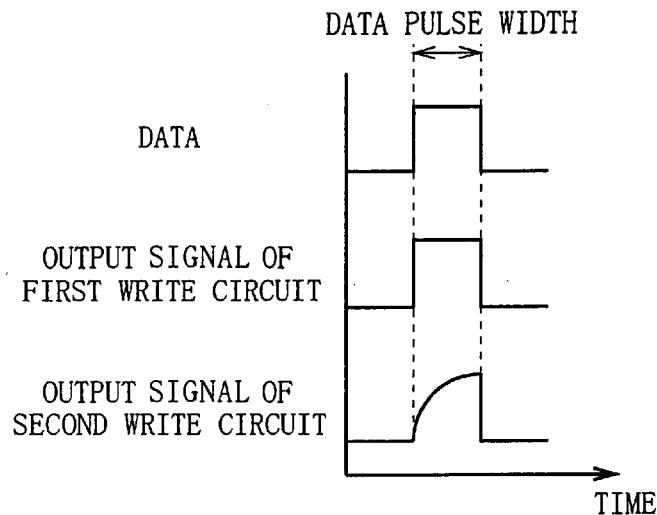
FIG. 22 is A waveform chart showing the operation of the write circuit of FIG. 21.

In the aforementioned write operation, waveforms of the output data signals of the first and second write circuits 72a and 72b are shown in the waveform chart of FIG. 22. When the data signal fed to the first and second write circuits 72a and 72b through the data line (e.g., D0) is a rectangular pulse of a predetermined pulse width (top curve in FIG. 22), the output signal of the first write circuit 72a will be a similar rectangular pulse. On the contrary, the output signal of the second write circuit 72b will be a rising pulse gently following the rectangular pulse.

That is, the output signal of the first write circuit 72a has a sharp rising edge, whereas the output signal of the second write circuit 72 has a gentle rising edge. In other words, the first write circuit 72a operates at high speed, and the second write circuit 72b operates at slow speed.

The memory cells 70 may be deteriorated with time by the repetitions of the read or write operations. Especially, when the memory cells 70 are nonvolatile memories as shown in FIG. 21, deterioration goes fast and there is a limit on the number or times data can be written to the memory cells 70. It is known that damage to the memory cells 70 increases as the pulse data signal to be applied has a sharper rising edge.

The device 106 comprises, as the write circuit 72, the first write circuit 72a capable of high-speed writing with high operating speed and the second write circuit 72b capable of reducing the damage to the memory cells 70 with low operating speed, wherein the selecting circuit 71 selectively transmits either of the respective output signals of the write circuits 72a and 72b to the memory cell array 1. This achieves high-speed writing in applications or operating periods where high speed is required, or suppresses the damage to the memory cell 70 while avoiding unnecessary high-speed operation in applications or operating periods where high speed is not required.

Especially in the device 106, the selection signal Sw is determined according to the contents of the register 73 in the CPU 11. This allows the switching between the first and second write circuits 72a and 72b by use of a program defining the operations of the CPU 11. Further, for determining the selection signal Sw, there are various forms as described in the second through fifth preferred embodiments: the selection signal Sw may be input from the outside, or determined on the basis of the divisional ratio of the clock signal Clk, or determined on the basis of the frequency of the clock signal Clk. It is also possible to combine the sixth preferred embodiment with the first through fifth preferred embodiments thereby to connect both the readout circuit 3 and the write circuit 72 in parallel.

In the aforementioned device 106, both the first and second write circuits 72a and 72b are driven and the selecting circuit 71 selects either of their output data signals to be transmitted to the memory cell array 1, but the device 106 may be modified so that only either one of the first and second write circuits 72a and 72b is driven by the selecting circuit 71. This reduces unnecessary power consumption. However, in either form or modification of the device 106, the first and second write circuits 72a and 72b exclusively (i.e., only one of them) write a data signal to the memory cell 70 specified by the address signal A in the memory cell array 1.

<B.7. Modification>

Figure 23:
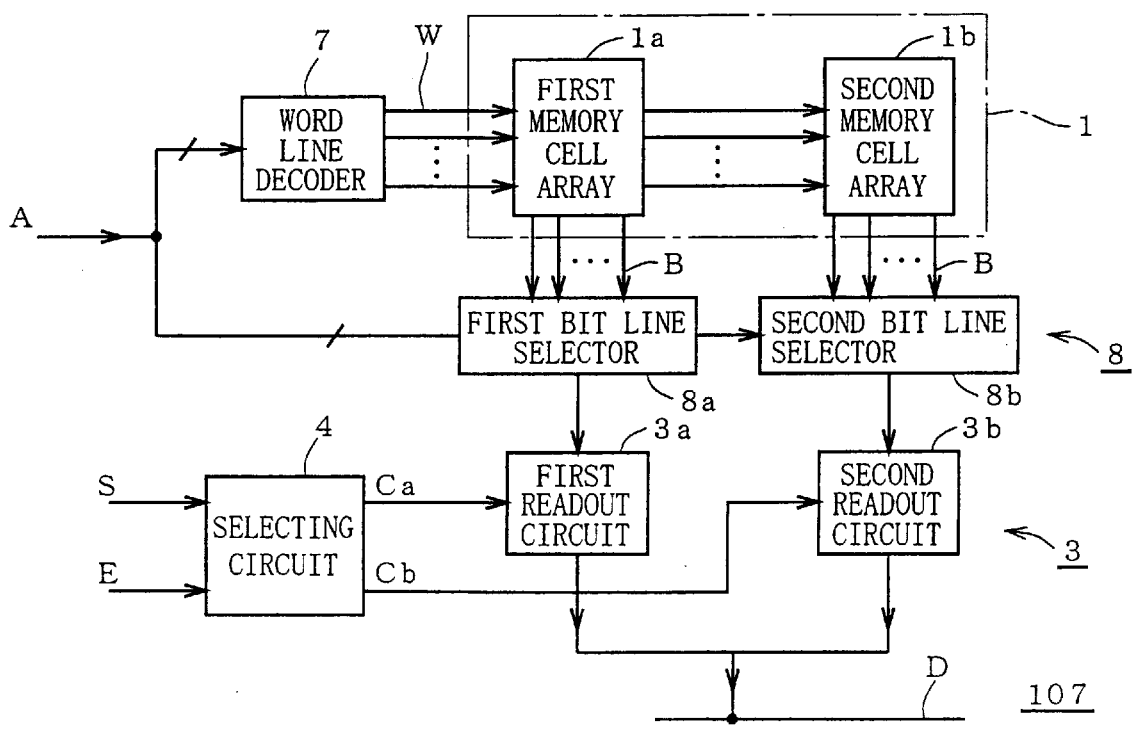
FIG. 23 is a block diagram showing a modification of the device.
Figure 24:
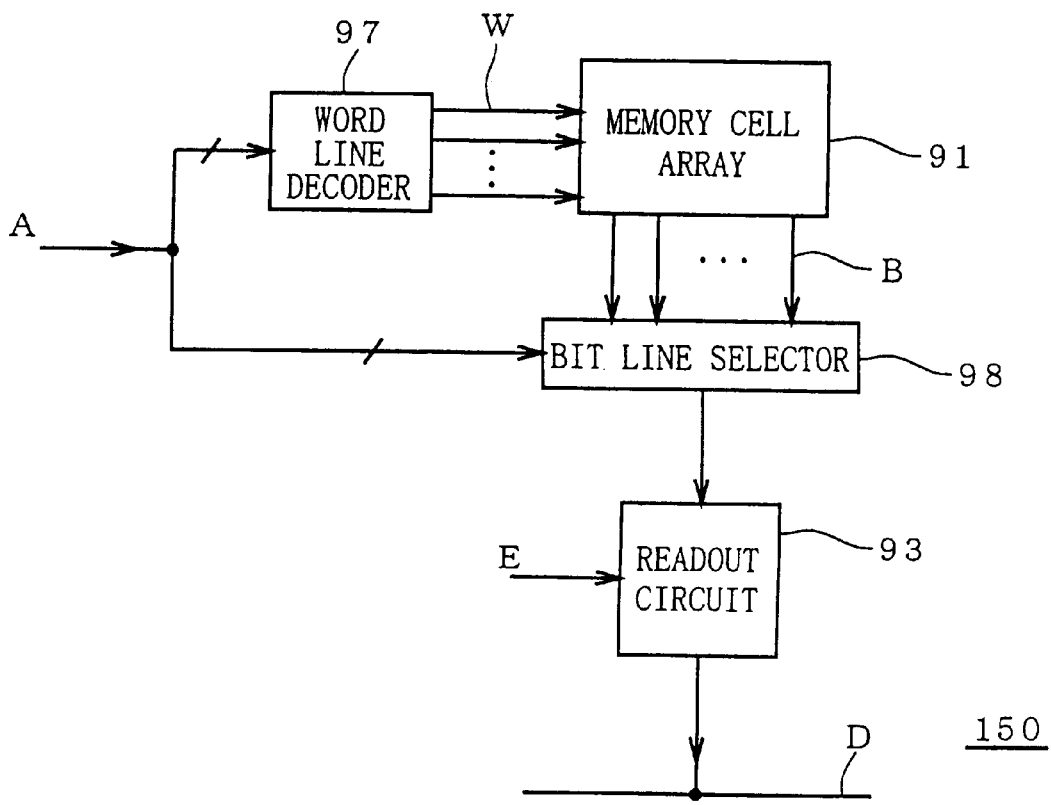
FIG. 24 is a block diagram of a conventional device.

In the first through fifth preferred embodiments, the holding signal of the common memory cell is fed to both the first and second readout circuits 3a and 3b. Alternatively, the device may be configured as shown in the block diagram of FIG. 23 so that holding signals of different memory cells having a common address are individually fed to the first and second readout circuits 3a and 3b.

In this device 107, the memory cell array 1 includes a first memory cell array 1a and a second memory cell array 1b having common addresses. The bit line selector 8 includes a first bit line selector 8a for selecting bit lines B of the first memory cell array 1a and a second bit line selector 8b for selecting bit lines B of the second memory cell array 1b. The first bit line selector 8a is connected to the first readout circuit 3a, whereas the second bit line selector 8b is connected to the second readout circuit 3b. This device is similar to those of the first through fifth preferred embodiments in that the outputs of the first and second readout circuits 3a and 3b are connected to the common data line D.

In this device 107, the selecting circuit 4 selectively drives either of the first and second readout circuits 3a and 3b. This reduces power consumption. By forming the first memory cell array 1a to be excellent in high-speed operation and the second memory cell array 1b to be excellent in low power consumption, the device 107 can further reduce power consumption in applications or operating periods where high speed is not required.

By making characteristics of the first and second bit line selectors 8a and 8b distinctive, further reduction in power consumption is possible. On the other hand, the devices of the first through fifth preferred embodiment have the advantage of reducing the area of the memory cell array 1 in the semiconductor chip to about a half of that in the device 107.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
   a memory cell array including a plurality of memory cells;
   a first readout circuit reading and outputting a signal which is held in a specified memory cell among said plurality of memory cells;
   a second readout circuit reading and outputting a signal which is held in a specified memory cell among said plurality of memory cells,
   said second readout circuit having a lower operating speed than said first readout circuit, wherein
   said first and second readout circuits operate exclusively;
   a CPU operating in synchronization with a clock signal and having access to said memory cell array;
   a frequency divider dividing an external clock signal fed from outside by a plurality of ratios to generate signals having a plurality of periods, and selectively supplying one of said signals to said CPU as said clock signal; and
   a comparator for comparing a divisional ratio of said clock signal to said external clock signal with a reference value,
   wherein if said divisional ratio is not smaller than said reference value according to a comparison result of said comparator, said second readout circuit exclusively operates among said first and second readout circuits, and if said divisional ratio is smaller than said reference value, said first readout circuit exclusively operates.

2. The semiconductor device according to claim 1, further comprising:
   an external terminal,
   wherein said comparator sets a value indicated by a signal fed from said external terminal as said reference value.

3. The semiconductor device according to claim 1, wherein
   said CPU includes a register;
   said frequency divider selects one of said signals having said plurality of periods on the basis of a signal held in said register; and
   said comparator determines said divisional ratio on the basis of said signal held in said register.

4. The semiconductor device according to claim 1, wherein
   memory cells to be read by said first and second readout circuit are the same.

5. The semiconductor device according to claim 1, wherein
   memory cells to be read by said first and second readout circuit are different memory cells having a common address.

6. The semiconductor device according to claim 1, further comprising:
   selecting circuit exclusively selecting one of said readout circuits based upon an input selection signal output from said comparator.

7. The semiconductor device according to claim 1, further comprising:
   a memory cell array including a plurality of memory cells;
   a first write circuit writing a data signal to a specified memory cell among said plurality of memory cells in synchronization with an enable signal; and
   a second write circuit writing a data signal to a specified memory cell among said plurality of memory cells in synchronization with an enable signal,
   said second write circuit having a lower operating speed than said first write circuit,
   said first and second write circuits operating exclusively.

8. A semiconductor device comprising:
   a memory cell array including a plurality of memory cells;
   a first readout circuit reading and outputting a signal which is held in a specified memory cell among said plurality of memory cells;
   a second readout circuit reading and outputting a signal which is held in a specified memory cell among said plurality of memory cells,
   said second readout circuit having a lower operating speed than said first readout circuit, wherein
   said first and second readout circuits operate exclusively;
   a CPU operating in synchronization with a clock signal and having access to said memory cell array;
   a reference delay generating circuit generating a pulse representing a predetermined delay time of said clock signal from the start of one clock period, for each of said one clock period; and
   a judging circuit for determining whether a time when said CPU directs the start of the operation of said first or second readout circuit is within said delay time or not,
   wherein if said time is within said delay time according to a judgment result of said judging circuit, said first readout circuit exclusively operates among said first and second readout circuits, and if said time is not within said delay time, said second readout circuit exclusively operates.

9. The semiconductor device according to claim 8, further comprising:
   a frequency divider dividing an external clock signal fed from the outside by a plurality of ratios to generate signals having a plurality of periods, and selectively supplying one of said signals to said CPU as said clock signal.

10. The semiconductor device according to claim 8, further comprising:
selecting circuit exclusively selecting one of said readout circuits based upon an input selection signal output from said judging circuit.

11. The semiconductor device according to claim 8, wherein
memory cells to be read by said first and second readout circuit are the same.

12. The semiconductor device according to claim 8, wherein
memory cells to be read by said first and second readout circuit are different memory cells having a common address.

13. The semiconductor device according to claim 8, further comprising:
a memory cell array including a plurality of memory cells;
a first write circuit writing a data signal to a specified memory cell among said plurality of memory cells in synchronization with an enable signal; and
a second write circuit writing a data signal to a specified memory cell among said plurality of memory cells in synchronization with an enable signal,
said second write circuit having a lower operating speed than said first write circuit,
said first and second write circuits operating exclusively.

14. A semiconductor device comprising:
a memory cell array including a plurality of memory cells;
a first write circuit writing a data signal to a specified memory cell among said plurality of memory cells in synchronization with an enable signal; and
a second write circuit writing a data signal to a specified memory cell among said plurality of memory cells in synchronization with an enable signal,
said second write circuit having a lower operating speed than said first write circuit,
said first and second write circuits operating exclusively;
a CPU operating in synchronization with a clock signal and having access to said memory cell array;
a frequency divider dividing an external clock signal fed from outside by a plurality of ratios to generate signals having a plurality of periods, and selectively supplying one of said signals to said CPU as said clock signal; and
a comparator comparing a divisional ratio of said clock signal to said external clock signal with a reference value,
wherein if said divisional ratio is not smaller than said reference value according to a comparison result of said comparator, said second write circuit exclusively performs writing among said first and second write circuits, and if said divisional ratio is smaller than said reference value, said first write circuit exclusively performs writing.

15. The semiconductor device according to claim 14, further comprising:
an external terminal,
wherein said comparator sets a value indicated by a signal fed from said external terminal as said reference value.

16. The semiconductor device according to claim 14, wherein
said CPU includes a register;
said frequency divider selects one of said signals having said plurality of periods on the basis of a signal held in said register; and
said comparator determines said divisional ratio on the basis of said signal held in said register.

17. A semiconductor device comprising:
a memory cell array including a plurality of memory cells;
a first write circuit writing a data signal to a specified memory cell among said plurality of memory cells in synchronization with an enable signal; and
a second write circuit writing a data signal to a specified memory cell among said plurality of memory cells in synchronization with an enable signal,
said second write circuit having a lower operating speed than said first write circuit,
said first and second write circuits operating exclusively;
a CPU operating in synchronization with a clock signal and having access to said memory cell array;
a reference delay generating circuit generating a pulse representing a predetermined delay time of said clock signal from the start of one clock period, for each of said one clock period; and
a judging circuit determining whether a time when said CPU directs the start of performing writing of said first or second write circuit is within said delay time or not,
wherein if said time is within said delay time according to a determination result of said judging circuit, said first write circuit exclusively performs writing among said first and second write circuits, and if said time is not within said delay time, said second write circuit exclusively performs writing.

18. The semiconductor device according to claim 17, further comprising:,
a frequency divider dividing an external clock signal fed from the outside by a plurality of ratios to generate signals having a plurality of periods, and selectively supplying one of said signals to said CPU as said clock signal.

* * * * *